United States Patent
Hu

(10) Patent No.: US 9,293,559 B2
(45) Date of Patent: Mar. 22, 2016

(54) DUAL TRENCH-GATE IGBT STRUCTURE

(71) Applicant: Alpha & Omega Semiconductor Incorporated, Sunnyvale, CA (US)

(72) Inventor: Jun Hu, San Bruno, CA (US)

(73) Assignee: Alpha and Omega Semiconductor Incorporated, Sunnyvale, CA (US)

(*) Notice: Subject to any disclaimer, the term of this patent is extended or adjusted under 35 U.S.C. 154(b) by 39 days.

(21) Appl. No.: 13/956,134

(22) Filed: Jul. 31, 2013

(65) Prior Publication Data

US 2015/0035003 A1    Feb. 5, 2015

(51) Int. Cl.
| | |
|---|---|
| H01L 27/108 | (2006.01) |
| H01L 29/66 | (2006.01) |
| H01L 29/739 | (2006.01) |
| H01L 29/15 | (2006.01) |

(52) U.S. Cl.
CPC ........ *H01L 29/66348* (2013.01); *H01L 29/157* (2013.01); *H01L 29/7397* (2013.01)

(58) Field of Classification Search
CPC ............ H01L 29/0696; H01L 29/1095; H01L 29/66325–29/66712; H01L 29/7393–29/7398; H01L 2924/13055
See application file for complete search history.

(56) References Cited

U.S. PATENT DOCUMENTS

| | | | | |
|---|---|---|---|---|
| 5,471,075 | A * | 11/1995 | Shekar et al. | 257/139 |
| 5,616,510 | A * | 4/1997 | Wong | 438/259 |
| 5,689,121 | A * | 11/1997 | Kitagawa et al. | 257/139 |
| 6,072,215 | A * | 6/2000 | Kawaji et al. | 257/334 |
| 6,359,308 | B1 * | 3/2002 | Hijzen et al. | 257/341 |
| 6,724,043 | B1 | 4/2004 | Ekkanath Madathil | |
| 2013/0001694 | A1 | 1/2013 | Guan et al. | |
| 2013/0049102 | A1 | 2/2013 | Bobde et al. | |
| 2014/0231866 | A1 * | 8/2014 | Senoo et al. | 257/139 |

OTHER PUBLICATIONS

U.S. Appl. No. 13/561,523, entitled "High Voltage Field Balance Metal Oxide Field Effect Transistor (FBM)" to Anup Bhalla, filed Jul. 30, 2012.

* cited by examiner

*Primary Examiner* — David Vu
*Assistant Examiner* — Cuong Nguyen
(74) *Attorney, Agent, or Firm* — Joshua D. Isenberg; JDI Patent

(57) ABSTRACT

Aspects of the present disclosure describe an IGBT device including a substrate including a bottom semiconductor layer of a first conductivity type and an upper semiconductor layer of a second conductivity type, at least one first gate formed in a corresponding first trench disposed over the substrate, and a second gate formed in a second trench disposed over the bottom semiconductor layer. The first and second trenches are provided with gate insulators on each side of the trenches and filled with polysilicon. The second trench extends vertically to depth deeper than the at least one first trench. The IGBT device further includes a body region of the first conductivity type provided between the at least one first gate and/or the second gate, and at least one stacked layer provided between a bottom of the at least one first gate and a top of the upper semiconductor layer. The at least one stacked layer includes a floating body region of the second conductivity type provided on top of a floating body region of the first conductivity type. It is emphasized that this abstract is provided to comply with rules requiring an abstract that will allow a searcher or other reader to quickly ascertain the subject matter of the technical disclosure. It is submitted with the understanding that it will not be used to interpret or limit the scope or meaning of the claims.

12 Claims, 7 Drawing Sheets

DUAL TRENCH-GATE IGBT STRUCTURE

FIELD OF THE INVENTION

This invention generally relates to semiconductor power devices. More particularly, this invention relates to device structures for insulated gate bipolar transistors (IGBT) and methods for manufacturing thereof.

BACKGROUND OF THE INVENTION

An insulated gate bipolar transistor (IGBT) is a semiconductor power device with a compositing structure that combines a metal-oxide-semiconductor field effect transistor (MOSFET) and a bipolar junction transistor (BJT). Performance features of an IGBT are designed to achieve a higher current density than the MOSFET's, and faster and more efficient switching characteristics and better control than the BJT's. Additionally, the drift region of the IGBT can be lightly doped for improved blocking ability. Meanwhile, the device can still have good conductivity because the lightly doped drift region undergoes high level carrier injection from a bottom P collector region resulting in conductivity modulation. With the MOSFET's characteristic of easy control with a gate electrode, the bipolar current flow mechanism and the advantages of shorter switching time and lower power loss, the IGBT is widely applied in a high voltage and high power application.

Conventional technologies to configure and manufacture IGBT devices are still confronted with difficulties and limitations to further improvement in performance due to various tradeoffs. In IGBT devices, there is a tradeoff between conduction loss and turn-off switching losses, $E_{off}$. Conduction loss depends upon the collector to emitter saturation voltage $V_{ce(SAT)}$ at rated current. More carrier injection while the device is on improves the conductivity of the device, thus reducing conduction loss. However, more carrier injection would also cause higher turn-off switching losses because of the energy dissipated in clearing out the injected carriers during turn-off.

Another trade-off exists between the IGBT's collector-emitter voltage at saturation ($V_{ce(SAT)}$) and its breakdown voltage ($V_{BD}$). While an increase on topside injection may improve $V_{ce(SAT)}$, it usually comes at a cost of lowering breakdown voltage $V_{BD}$. An IGBT device with a high density deep trench may overcome this trade-off, but it is hard to make such device with a high density of small pitch high aspect ratio trenches.

There are different configurations of IGBT devices, such as planar gate IGBT devices and IGBT device of the trench gate type. FIG. 1A is a cross sectional view of a conventional planar gate IGBT. FIG. 1B is a cross sectional view of another conventional IGBT device that has a trench gate. Both configurations of FIGS. 1A and 1B include a second gate G2 disposed over a p-type well region (20 or 120) to form a MOSFET channel between the first well region (22 or 122) and the drift region (24 or 124). Since the p-type well region 20 (also similar for p-type well region 120) has a P region 20a in the main current path and a region 20b extends upwardly to the surface 18 of the structure, it makes the fabrication process complicated. In addition, for the planar gate IGBT device, the second gate G2 wastes active device area.

It is within this context that embodiments of the present invention arise.

BRIEF DESCRIPTION OF THE DRAWINGS

FIG. 3 is a chart showing the voltage of the IGBT device of the present disclosure when the device turns on.

DESCRIPTION OF THE SPECIFIC EMBODIMENTS

Figure 1A:
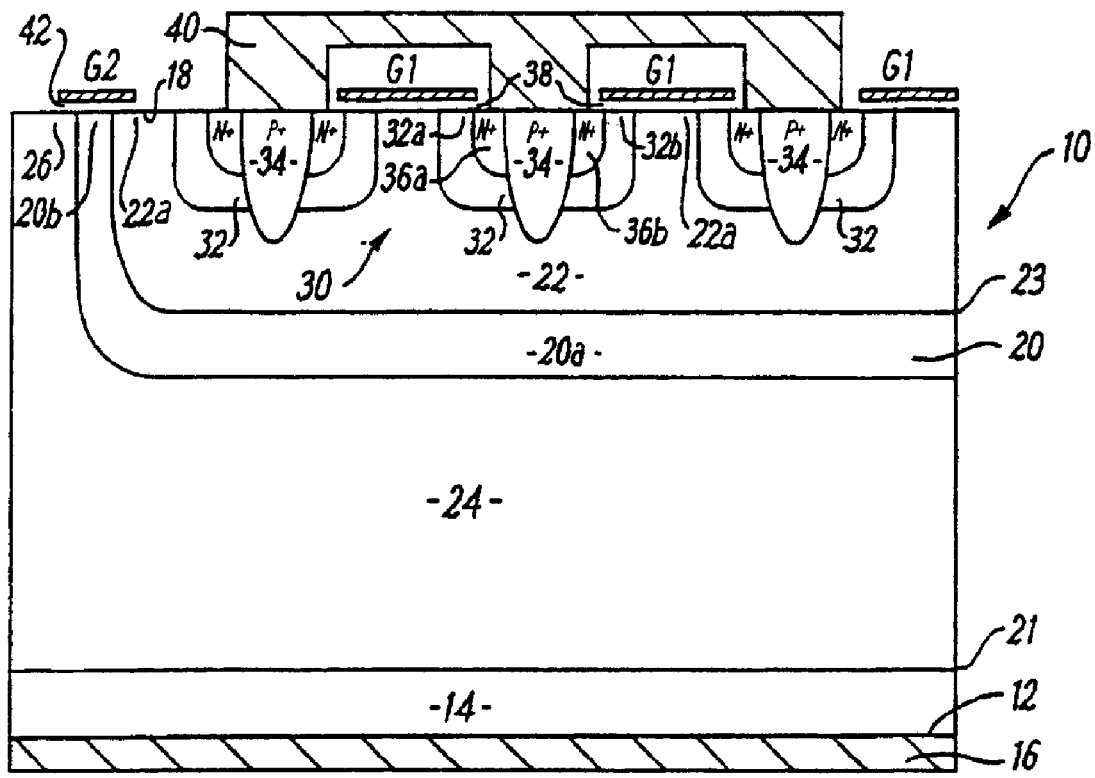
FIGS. 1A and 1B are cross sectional views showing two different configurations of conventional IGBT devices.
Figure 1B:
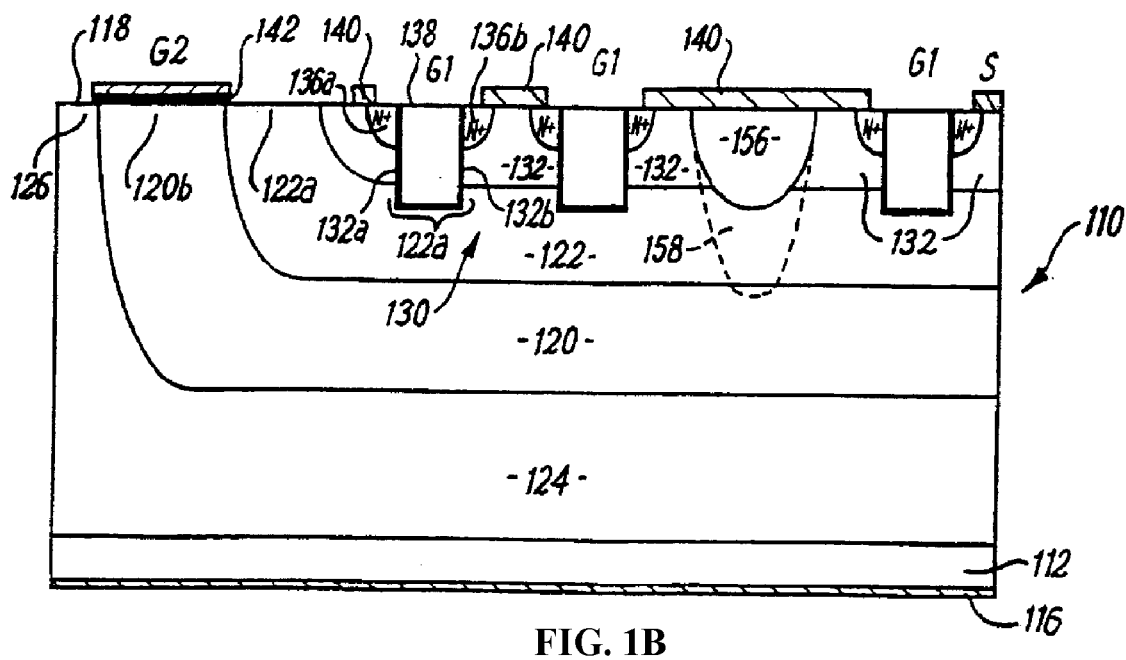

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In the following detailed description, reference is made to the accompanying drawings, which form a part hereof, and in which is shown by way of illustration specific embodiments in which the invention may be practiced. In this regard, directional terminology, such as "top," "bottom," "front," "back," "first," "second," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. that are within the recited limits.

In the following discussion, the first conductivity type is typically P and the second conductivity type is N. However, it should be noted that substantially similar devices may be fabricated using a similar process but with opposite conductivity types.

According to one aspect of the present disclosure, an IGBT device comprises a substrate including a bottom semiconductor layer of a first conductivity type and an upper semiconductor layer of a second conductivity type; at least one first gate formed in a corresponding first trench disposed over the substrate, wherein the first trench is provided with a gate insulator on each side of the first trench and filled with polysilicon; a second gate formed in a second trench disposed over the bottom semiconductor layer, wherein the second trench is provided with a gate insulator on each side of the trench and filled with polysilicon, and wherein the second trench extends vertically to a depth deeper than that of the at least one first trench; a body region of the first conductivity type provided between the at least one first gate and/or the second gate; and at least one stacked layer provided between a bottom of the at least one first gate and a top of the upper semiconductor layer, wherein the at least one stacked layer includes a floating body region of the second conductivity type provided on top of a floating body region of the first conductivity type. The at least one stacked layer is disposed between a bottom of the second trench and a bottom of the at least one first trench.

According to another aspect of the present disclosure, a method for forming an IGBT device comprises providing a substrate including a bottom semiconductor layer of a first conductivity and an upper semiconductor layer of a second conductivity located above the bottom semiconductor layer, and forming at least one first trench for a first gate and a second trench for a second gate in the substrate. Each of the at least one first trench and the second trench is provided with a gate insulator and filled with polysilicon. The second trench extends vertically to a depth deeper than that of the at least one first trench. The method further comprises forming at least one stacked layer over the upper semiconductor layer, and forming a body region of the first conductivity type over the at least one stacked layer. The at least one stacked layer includes a floating body layer of second conductivity type provided on top of a floating body layer of the first conductivity type. The at least one stacked layer is located at a depth between a bottom of the second gate and a bottom of the at least one first trench.

Figure 2:
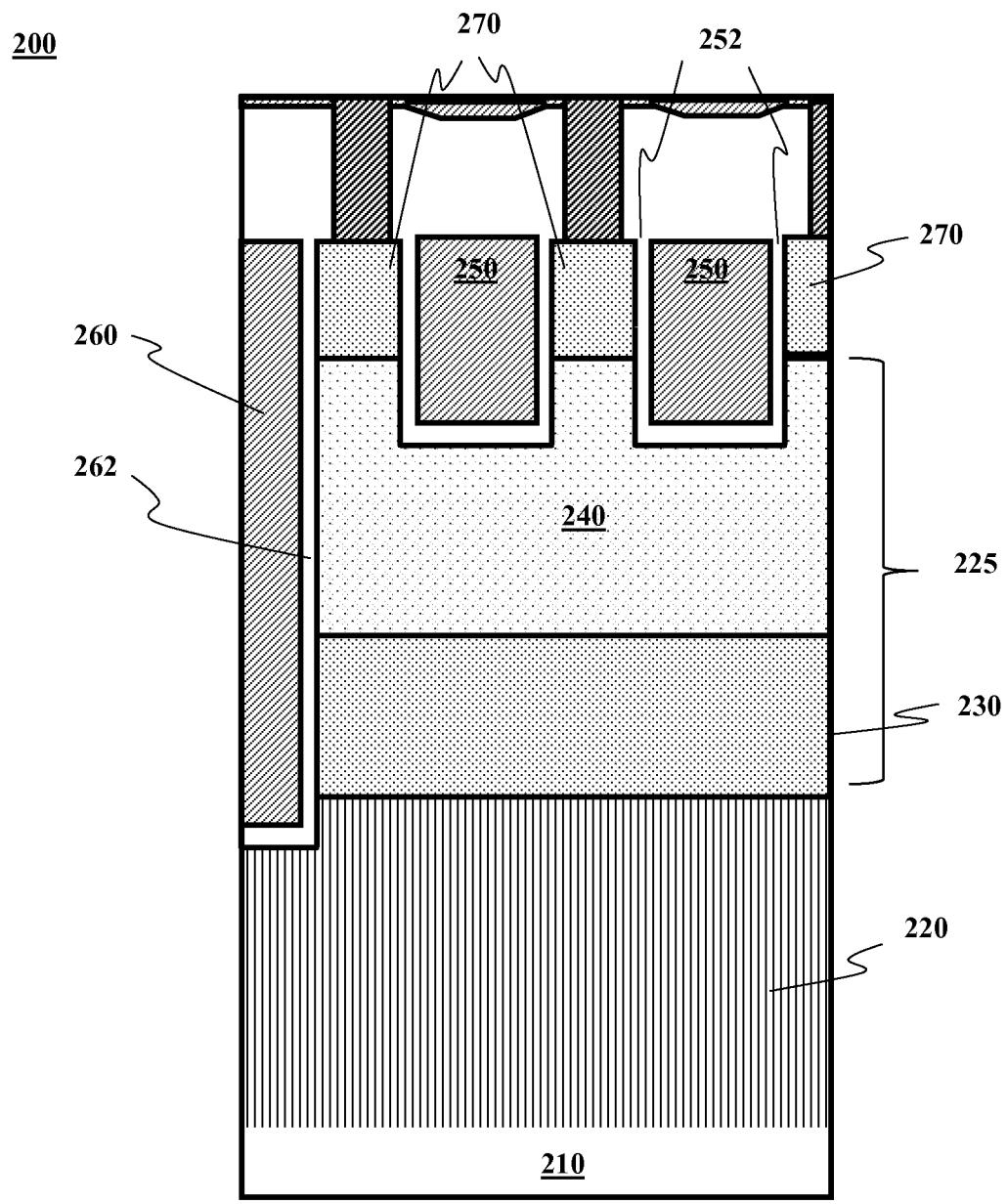
FIG. 2 is a cross-sectional view of an IGBT device according to an aspect of the present disclosure.

FIG. 2 is a cross-sectional view of an IGBT device having a dual trench gate configuration according to one aspect of the present disclosure. The IGBT device 200 is formed in semiconductor substrate 210 that has a first conductivity type, e.g., a P type substrate. An epitaxial layer 220 of a second conductivity type, e.g., an N-epitaxial layer, is provided on top of the P-type substrate 210. Alternatively, the P type substrate 210 and the epitaxial layer 220 may together be referred to as the semiconductor substrate since they both generally have a monocrystalline structure. In addition, the P-type substrate 210 may be more generally referred to as a bottom or lower semiconductor layer and functions as a collector region. The epitaxial layer 220 may be more generally referred to as an upper semiconductor layer and functions as a drift region above the collector region 210. In one embodiment, the IGBT device 200 is a vertical IGBT device with a collector electrode (not shown) disposed on a bottom surface of the substrate and an emitter electrode (not shown) disposed on a top surface of the substrate.

The IGBT device 200 of FIG. 2 includes at least one shallow gate 250 forming over the collector region 210 and the drift region 220. The at least one shallow gate 250 is formed in a corresponding trench structure. The trench structure is provided with a gate insulator (e.g., gate oxide 252) on each side of the trenches and all completely filled with polysilicon. Specifically, the at least one shallow gate 250 extends vertically to a depth approximately in a range from 1 to 3 microns with pitch of 1 to 3 microns. The trench width is about 0.6 microns for 1 micron pitch and about 1.5 micron for 3 micron pitch.

The IGBT device 200 further includes a deep gate 260 disposed at a distance away from the shallow gate 250, preferably in a distance of between about 1 micron and about 10 microns. The deep gate 260 formed in a trench structure is disposed over the collector region 210. The trench structure is provided with a gate insulator (e.g., gate oxide 262) on each side of the trenches and completely filled with polysilicon. Specifically, the deep gate 260 should extend about 3 to 6 microns deeper than the shallow gate 250. In one example, the deep gate 260 may extend vertically to a depth ranging from about 4 to 9 microns with a trench opening of 1 to 3 microns. The depth of the deep gate 260 may be chosen such that the bottom of the deep gate 260 reaches into the drift region 220.

The IGBT device according to the embodiments of the present disclosure may have any number of shallow gates 250 disposed between two deep gates 260, e.g., one to ten shallow gates between two deep gates 260. The thickness of the gate oxide around the trench for the shallow gate 250 and the deep gate 260 is thinner than that of regular trench IGBT devices. Normally, a regular trench IGBT device requires a thickness of 5000 angstrom gate oxide to provide sufficient electrical shielding, particularly on the bottom of the trench. For the IGBT device of the present disclosure, the gate oxide around the trench for the shallow gate 250 may be in a thickness ranging from 400 to 1000 angstroms. The gate oxide around the trench for the deep gate 260 may have the same or similar thickness, or alternatively, may be 1000 angstroms to 5000 angstroms.

A body/emitter region 270 of the first conductivity type (e.g., P body) is disposed between every two gate structures (either a deep gate or a shallow gate). The body region 270 has a lower penetration depth in comparison with the shallow gates 250. The doping concentration of the P body/emitter region 270 ranges from about 5e17 $cm^{-3}$ to 5e19 $cm^{-3}$.

Between the bottom of the shallow gate 250 and the top of the N drift region 220 and between two deep gates 260, the IGBT device 200 further includes at least one structure 225 of n-p stacked layers. The structure 225 of n-p stacked layers includes a floating body region 240 of the second conductivity type (e.g., floating N body) provided on top of a floating body region 230 of the first conductivity type (e.g., floating P body). The thickness of the floating P body 230 may be in a range from about 1 micron to about 2.5 microns. The thickness of the floating N body 240 may be about 2 to 5 microns. The bottom of the structure 225 of n-p stacked layers is above the bottom of the deep gate 260. Preferably, the floating P body 230 is provided close to the bottom of the deep gate 260 to provide electrical shielding to the bottom corner of the second gate. In one embodiment, the IGBT device may include multiple structures 225 over the drift region 220 to further improve the topside injection and thereby improving $V_{ce(SAT)}$. The doping concentrations of the floating body regions of the first and second conductivity types may depend on whether the floating body region is p-type or n-type. By way of example, the doping concentration of a P-type floating body region may range from about 1e16 $cm^{-3}$ to about 5e17 $cm^{-3}$ and is lower than the doping concentration of the body region 270. By way of example, and not by way of limitation an N-type floating body region may have a doping concentration from about 3e16 $cm^{-3}$ to about 1e18 $cm^{-3}$.

The doping concentration of the floating P body 230 is chosen so that the threshold voltage of the deep gate 260 is lower than the threshold voltage of the shallow gate 250. In addition, the doping concentration of the floating P body 230 has to be lower than that of the P body 270. By such control of the doping concentration of the floating P body 230, the shallow gate 250 controls when the device turns on and off. That is, the shallow gate 250 is the control gate of the device 200. In one example, the doping concentration of the floating P body 230 is about one order of magnitude lower than that of the P body 270.

The IGBT device of the present disclosure provides several advantages over conventional IGBT devices.

For a conventional trench IGBT device without the floating P body 230, there is a fundamental trade-off between the $V_{ce(SAT)}$ and the breakdown voltage because the breakdown voltage is very sensitive to the doping level of the N region under the P body 270. A low $V_{ce(SAT)}$ can be achieved by increasing the doping of the N region under the P body and increasing the injection efficiency from the topside, However, a higher doping level of the N region under the P body 270 will lower the breakdown voltage of the device.

For the IGBT device of the present disclosure, the floating P body 230, combined with the deep trench structure, isolates the floating N body 240 above the floating p body and provides a charge balance and a good electrical field shield to the floating N body 240. Under the reverse bias, the sidewall between the floating N body 240 and the deep trench gate 260 is depleted at a low voltage and make the floating P body 230 and the P body 270 punching-through. So the voltage drop between P body 270 and the floating N body 240 is clamped at an electrical field lower than the critical electrical field, which is called "self clamping". The avalanche breakdown only happens at the junction between floating P body 230 and the N drift layer 220. Therefore, the breakdown voltage of the IGBT is not sensitive to the doping concentration of the floating N body 240. For the same breakdown voltage rating, the doping level of the floating N body 240 under the P body 270 of the IGBT device of the present disclosure can be 5 to 10 times higher than doping of the N region under the P body of the conventional IGBT devices.

Because of the much higher doping of the floating N body 240, when the device is at on-state, the injection efficiency from the top side is enhanced and the carrier concentration under the P body is 5 to 10 times higher than the conventional IGBT devices. In addition to that, at the on-state, the $V_{gs}$ applied on the trench gate 250 forms a vertical channel on the side wall of the P body 270, the floating N body 240 is shorted to emitter potential through the vertical channel. In this case, a thyristor structure is formed by the P substrate 210, the N drift layer 220, the floating P body 230 and the floating N body 240. Both the thyristor structure and the high topside injection enhancement contribute to a significantly lower $V_{ce(SAT)}$ than the conventional IGBT devices.

Figure 3:
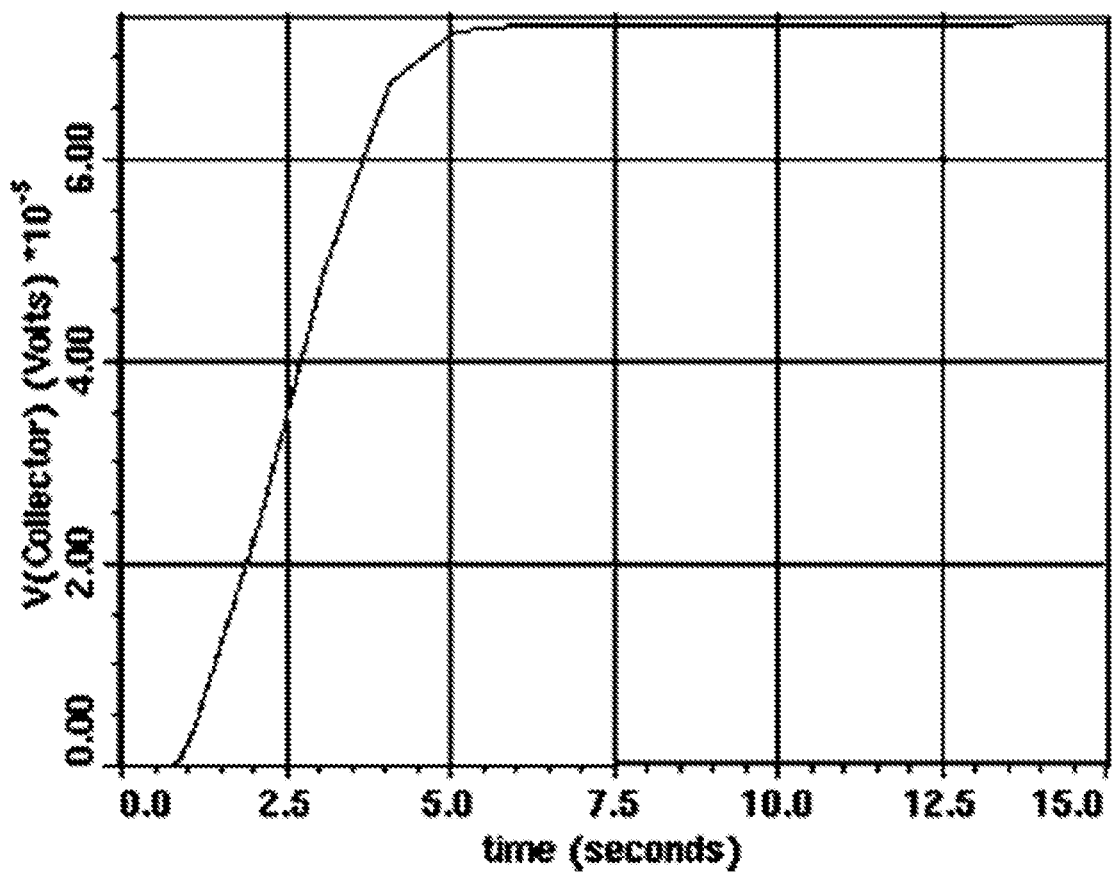

Though the IGBT device of the present disclosure show thyristor I-V curves at the on-state, The forward I-V characteristics of the device do not have a snapback like a thyristor. Conventionally, there is a snapback in the IV curve when a thyristor device turns on. That is, the voltage initially goes up and then snaps back. For IGBT devices of the type described in the present disclosure, when the gate bias is applied on the deep trench 260, an inversion channel is formed at the side wall of the floating P body 230, which shorts the floating N body 240 to the N drift layer 220. When the collector voltage start to increases from 0V, the current only go through the inversion channel at the side wall of the floating P body 230 and the device is turning on like a conventional IGBT. With the increase of the total current, the voltage difference through the floating P body 230 increases, more and more current gradually moves to the center of the floating P body 230 and the device behaves more like a thyristor. FIG. 3 is a chart showing the voltage of the IGBT device of the present disclosure goes up without having a snapback when the device turns on.

Moreover, unlike the MOS controlled Thyristor, the IGBT device of this present disclosure show a good saturation current, which is important for the short circuit robustness of the devices. When the voltage of the collector increases, the gate-collector bias forms a depletion layer on the side wall of deep trench gate 262, which will make the floating p body 230 and P body 270 punching-through and provide a path for the hole current. The holes coming into the floating P body 230 will sweep into the P body 270 through this path, therefore the current going to the floating N body 240 is limited and the device is saturated like a conventional IGBT devices. FIG. 3 also shows the current saturation of the IGBT device of the present disclosure when the collector voltage $V_{ce}$ is high.

Moreover, the IGBT devices of the present disclosure have a fast turn off and a low turn off loss. When the device turns off, reverse bias is applied to the collector and the deep trench gate and shallow trench gate are connected to ground potential. Electrons go to the positively biased collector at bottom of the device while holes are pushed into the floating P body 230. The sidewall of the floating N body 240 is depleted under the reverse bias between the collector and the deep trench gate 260, and thereby forming a current path for holes to drift along the sidewall of the deep gate 260 to the emitter electrode quickly. Therefore the IGBT device of the present disclosure can be turned off fast and the turn off loss is also low.

It was found that an increase on the dose for the body/emitter region 270 may improve short circuit capability (i.e., decreasing saturation current) and thereby increasing the short circuit withstand time. The short circuit capability of the IGBT devices is determined by the Saturation current and the uniformity of the current spreading over the core cell. A lower saturation current and a more uniform current spreading give a more robust short circuit safe-operation-area (SC-SOA). When the IGBT is under the saturation region, the P body (270) junction is reverse bias and limits the magnitude of the saturation current. A higher dose of the P body 270 give a lower saturation current, which improve the SC-SOA significantly.

For the IGBT devices of the present disclosure, The P body junction and the shallow trench oxide do not need to support high electrical field under the reverse bias because of the "self clamping". Therefore, for the same $V_{th}$, a thinner gate oxide on the trench for the shallow gate and a higher dose for the body/emitter region 270 may be implemented more readily and a lower saturation current may be achieved compared to conventional IGBT devices. TABLE I below shows that, for the same $V_{th}$, P body dose of dual trench gate IGBT of the present disclosure can be much higher than traditional IGBT (TIGBT) because of the thinner gate oxide for the shallow gate and shallower depth of the body/emitter region.

| Body dose | TIGBT | 1.0e14 | 1.5e14 |
| --- | --- | --- | --- |
| $V_{ceSAT}$@200 A/cm² | 1.58 V | 1.35 V | 1.37 V |
| BV | 1443 V | 1467 V | 1474 V |
| $J_{SAT}$ (A/cm²) | 8760 | 3233 | 2038 |
| SCWT (μsec) | 1.58 | 2.7 | 4.81 |

Figure 4A:
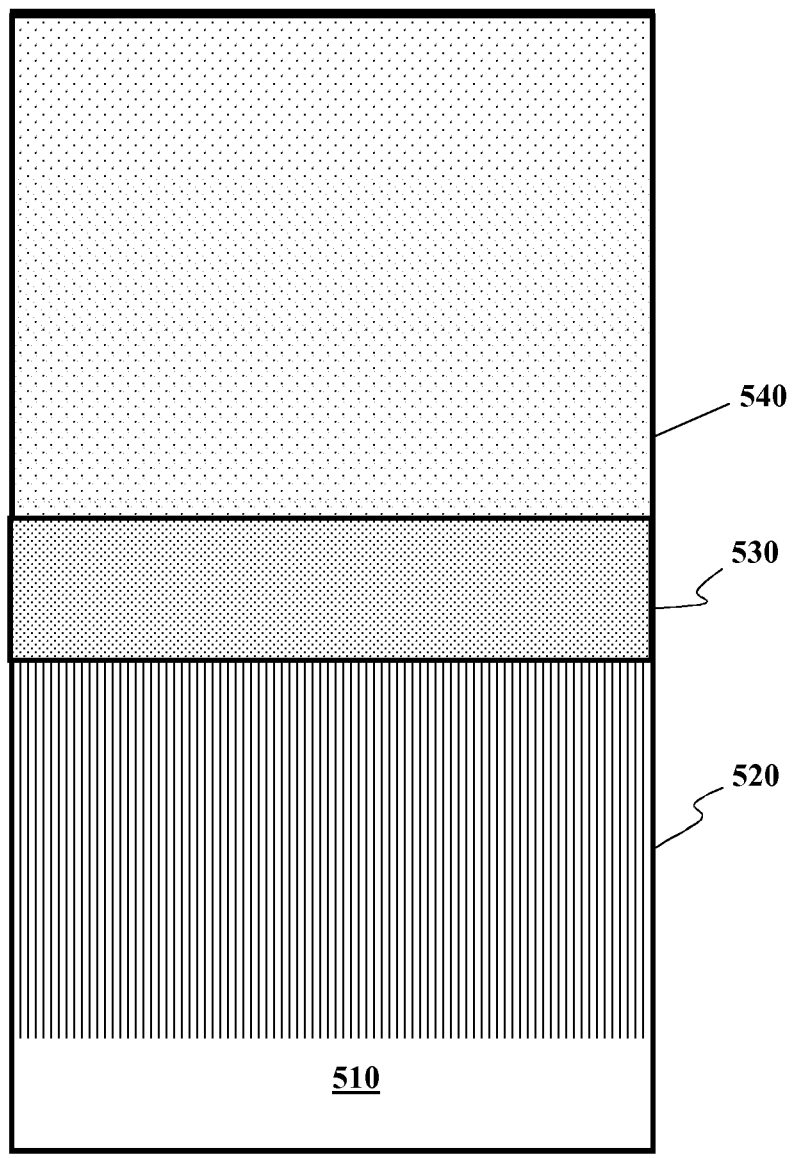
FIGS. 4A-4C are cross sectional views illustrating a process of forming an IGBT device according to the embodiments of the present disclosure.
Figure 4B:
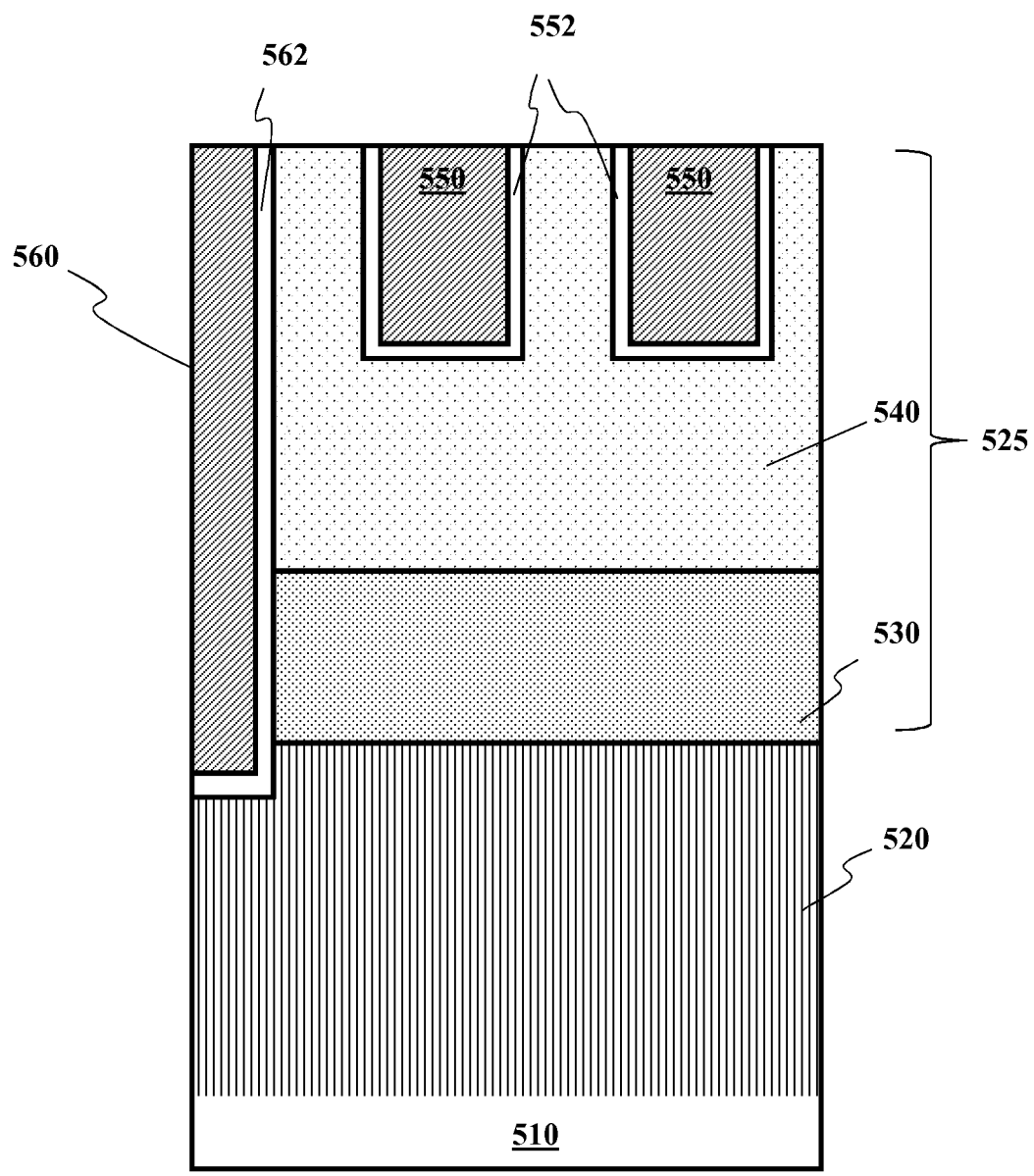
Figure 4C:
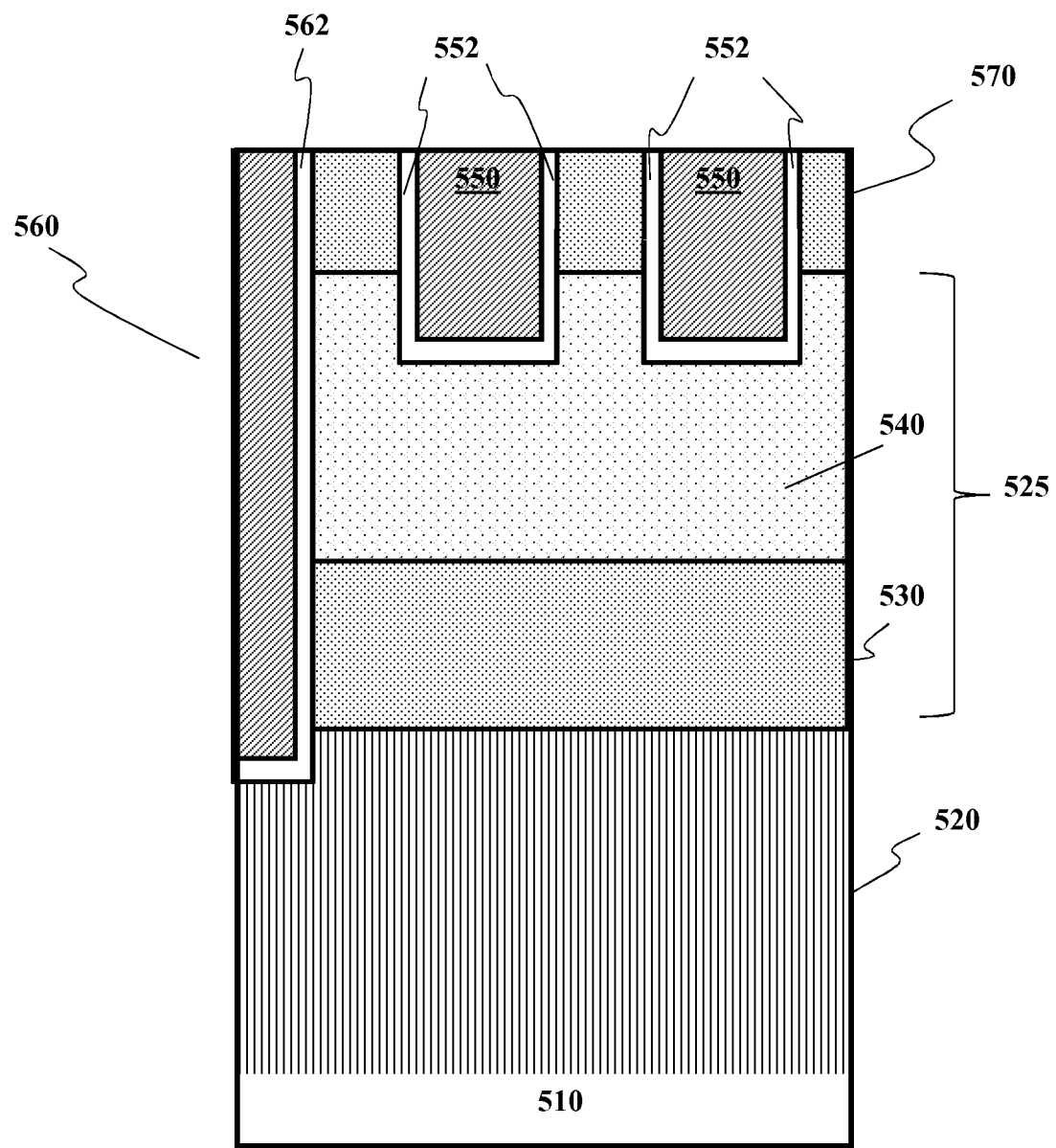

FIGS. 4A-4C show a example of a possible method of forming the IGBT device 500 of the present disclosure. FIG. 4A shows a starting semiconductor substrate including a bottom semiconductor layer 510 of a first conductivity type (e.g., a P-type substrate) and a semiconductor layer 520 of a second conductivity type that is opposite the first conductivity type (e.g., an N-epitaxial layer) located thereon. A semiconductor layer 530 of a first conductivity type and a semiconductor layer 540 of a second conductivity type may be formed by epitaxial growth or ion implant. By way of example using ion implant, and not by way of limitation, the P-type dopants of the layer 530 of a first conductivity type may be boron or BF2, and the N-type dopants of the layer 540 of a second conductivity type may be phosphorus, arsenic, or antimony. In FIG. 4B, deep trenches are etched through the semiconductor layers 540 and 530 and slightly into the semiconductor layer 520.

It is desirable for the deep trench depth to be well controlled to make sure that the semiconductor layer 530 provides good electrical field shielding under reverse bias and the deep trench poly gate 560 is deeper than the semiconductor layer 530

At least one shallow trench is formed between two adjacent deep trenches. Preferably, the bottom of the shallow trench does not touch the bottom of the semiconductor layer 530. In one embodiment, two processes may be used to form the trenches for the shallow gate 550 and for the deep gate 560. The trenches may then be lined with a dielectric (e.g., oxide 552 and 562). The deep trench gate oxide 562 and the shallow trench gate oxide 552 may be formed in one oxide deposition process and have the same thickness. Alternatively, the deep trench gate oxide 562 and the shallow trench gate oxide 552 may be formed on two separated oxide deposition processes and have different thickness. Thereafter, a gate electrode material (e.g., polysilicon) is then filled into the trenches to form gate electrode. Alternatively, the P layer 530 and N layer 540 may be formed by ion implant in the process after depositing the gate electrode material. A P body region 570 and the source region (not shown) are formed (e.g., by implantation) on top of the N layer 540 shown in FIG. 4C. An emitter electrode (not shown) is formed on the top surface contacting the source region and P body region 570. A gate electrode (not shown) is formed by electrical connecting the deep trench poly gate 560 and shallow poly gate 550. A collector electrode (not shown) may be formed on the back surface contacting the bottom semiconductor layer 510.

Figure 5:
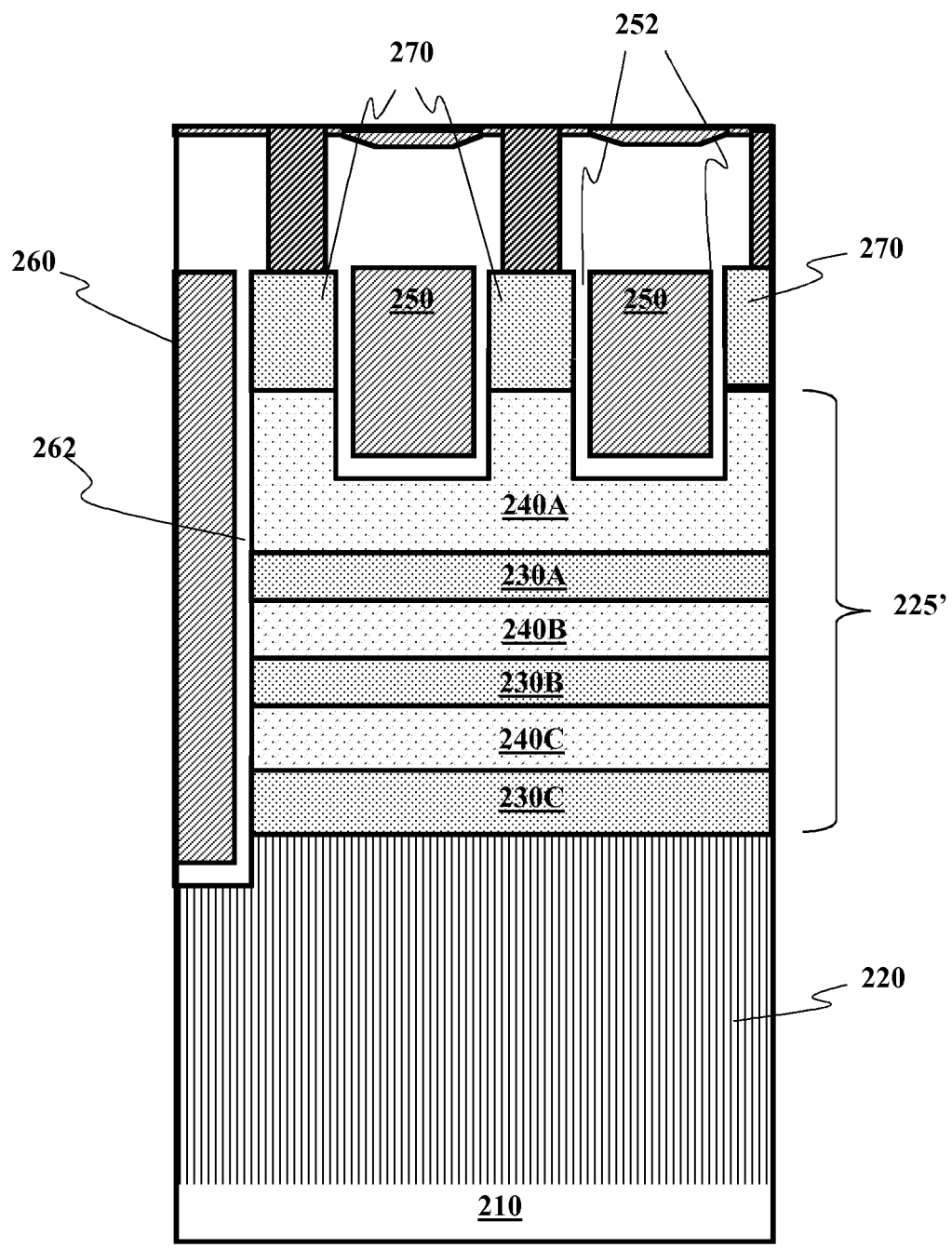
FIG. 5 is a cross-sectional view of an alternative IGBT device according to an aspect of the present disclosure.

It is noted that the foregoing discussion involves examples in which the stacked structure 225 of n-p stacked layers includes a single first conductivity type region 230 and a single second type conductivity type floating body region 240. However, aspects of the present disclosure are not limited to such examples. By way of example, and not by way of limitation FIG. 5 illustrates an alternative IGBT device 200' that includes a stacked structure 225' that includes multiple n-p stacked layers. The IGBT device 200' is otherwise similar in configuration to the device 200 depicted in FIG. 2 and described above. Reference numerals common to FIG. 2 and FIG. 5 refer to the same structures. In the alternative device 200', the stacked structure 225' includes a first stack having a second conductivity type region 240A on top of a first conductivity type region 230A. A second stack and third stack is located between the first stack and the second conductivity type epitaxial layer 220. The second stack includes a second conductivity type region 240B on top of a first conductivity type region 230B. The third stack includes a second conductivity type region 240C on top of a first conductivity type region 230C. By using multiple stacked layers structure, the conduction losses and short circuit SOA can be further improved.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An insulating gate bipolar transistor (IGBT) device, comprising:
   a substrate including a bottom semiconductor layer of a first conductivity type and an upper semiconductor layer of a second conductivity type that is opposite the first conductivity type;
   at least one first gate formed in a corresponding first trench disposed over the substrate, wherein the at least one first trench is provided with a gate insulator on each side of the first trench and filled with polysilicon;
   a second gate formed in a second trench disposed over the bottom semiconductor layer, wherein the second trench is provided with a gate insulator on each side of the second trench and filled with polysilicon;
   a body region of the first conductivity type provided between the at least one first gate and the second gate; and
   at least one stacked layer provided between a bottom of the at least one first gate and a top of the upper semiconductor layer, wherein the at least one stacked layer includes a floating body region of the second conductivity type provided on top of a floating body region of the first conductivity type, wherein the at least one first trench and the second trench extend vertically in the at least one stacked layer, wherein the second trench extends vertically deeper in depth than the at least one first trench and wherein the at least one stacked layer is located at a depth between a bottom of the second gate and a bottom of the at least one first trench, wherein a bottom of the second gate reaches into the upper semiconductor layer.

2. The IGBT device of claim 1, wherein a bottom of the at least one stacked layer is above a bottom of the second gate.

3. The IGBT device of claim 1, wherein the at least one first gate extends vertically about 1 to about 3 microns in depth with a pitch of about 1 to 3 microns.

4. The IGBT device of claim 1, wherein the second gate extends vertically about 3 to 6 microns deeper in depth than the at least one first gate.

5. The IGBT device of claim 1, wherein the floating body region of the first conductivity type is adjacent to one sidewall of the second gate.

6. The IGBT device of claim 1, wherein a doping concentration of the body region of the first conductivity type is lower than a doping concentration of the floating body region of the first conductivity type.

7. The IGBT device of claim 1, wherein the first conductivity type is P and the second conductivity type is N.

8. The IGBT device of claim 1, wherein the first conductivity type is N and the second conductivity type is P.

9. The IGBT device of claim 1, wherein a doping concentration of the body region of the first conductivity type ranges from about $5e17$ $cm^{-3}$ to about $5e19$ $cm^{-3}$.

10. The IGBT device of claim 1, wherein at least one floating body region of the first or second conductivity type is P-type and has a doping concentration ranging from about $1e16$ $cm^{-3}$ to about $5e17$ $cm^{-3}$ and is lower than a doping concentration of the body region.

11. The IGBT device of claim 1, wherein at least one floating body region of the first or second conductivity type is N-type and has a doping concentration from about $3e16$ $cm^3$ to about $1e18$ $cm^3$.

12. The IGBT device of claim 1, wherein the at least one first gate controls when the IGBT device turns on and off.

* * * * *